United States Patent [19]
Atsumi

[11] Patent Number: 5,291,045
[45] Date of Patent: Mar. 1, 1994

[54] NON-VOLATILE SEMICONDUCTOR MEMORY DEVICE USING A DIFFERENTIAL CELL IN A MEMORY CELL

[75] Inventor: Shigeru Atsumi, Tokyo, Japan
[73] Assignee: Kabushiki Kaisha Toshiba, Saiwai, Japan
[21] Appl. No.: 677,564
[22] Filed: Mar. 29, 1991
[51] Int. Cl.$^5$ .................. H01L 27/10; H01L 27/108; G11C 5/02
[52] U.S. Cl. .................. 257/296; 257/208; 257/209; 365/51
[58] Field of Search .................. 357/23.5, 23.6, 45; 365/51; 257/369, 390, 208, 209

[56] References Cited

U.S. PATENT DOCUMENTS 4,896,295 1/1990 Corda .................. 257/390
5,204,542 4/1993 Namaki et al. .................. 257/390

FOREIGN PATENT DOCUMENTS 0337393 10/1989 European Pat. Off. .
0396263 7/1990 European Pat. Off. .

OTHER PUBLICATIONS

"A 23ns 256k EPROM with Double-Layer Metal and Address Transition Detection." Hoff, D., et al., ISSCC Digest of Technical Papers, (pp. 130–131), Feb. 16, 1989.

Primary Examiner—Rolf Hille
Assistant Examiner—Wael Fahmy
Attorney, Agent, or Firm—Banner, Birch, McKie & Beckett

[57] ABSTRACT

According to this invention, in a non-volatile semiconductor memory device, each memory cell for storing 1-bit data consists of two transistors, one transitor constituting each memory cell is formed in a memory cell array consisting of a plurality of bit lines and a plurality of word lines, and the other transistor constituting each memory cell is formed in a second memory cell array consisting of a plurality of bit lines and a plurality of word lines.

4 Claims, 6 Drawing Sheets

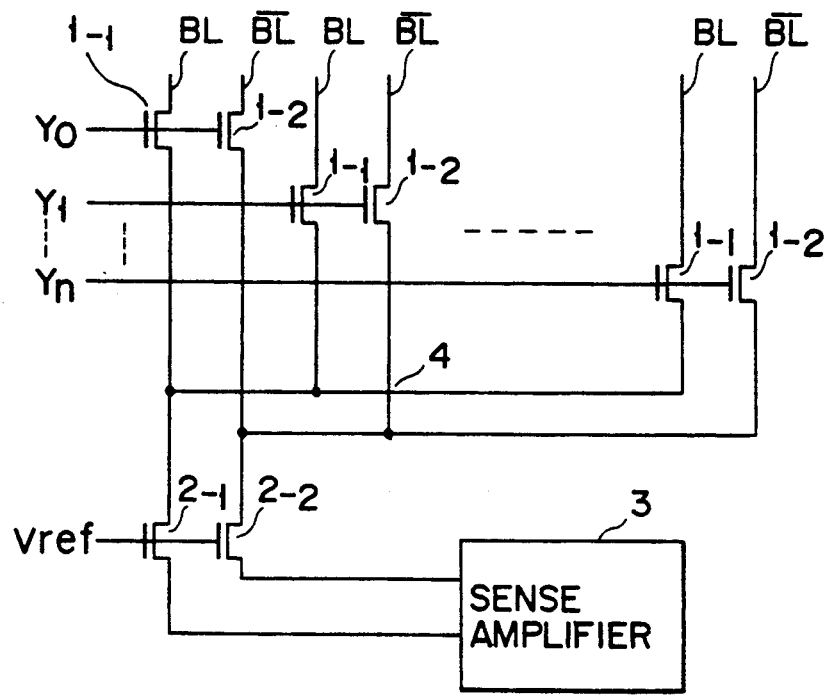
F I G. 1
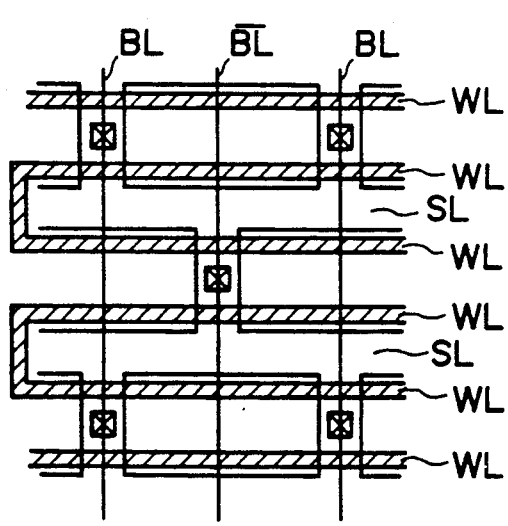
F I G. 2A
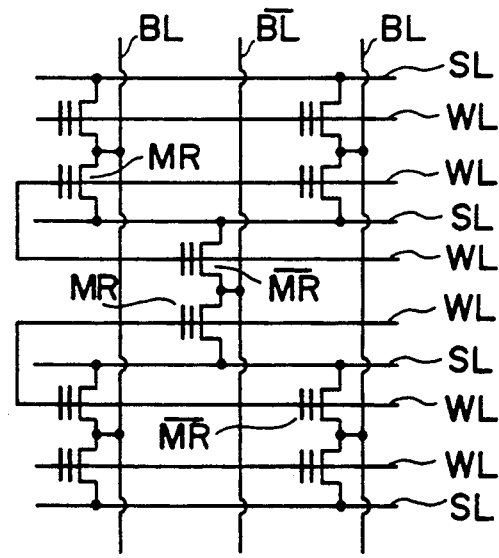
F I G. 2B

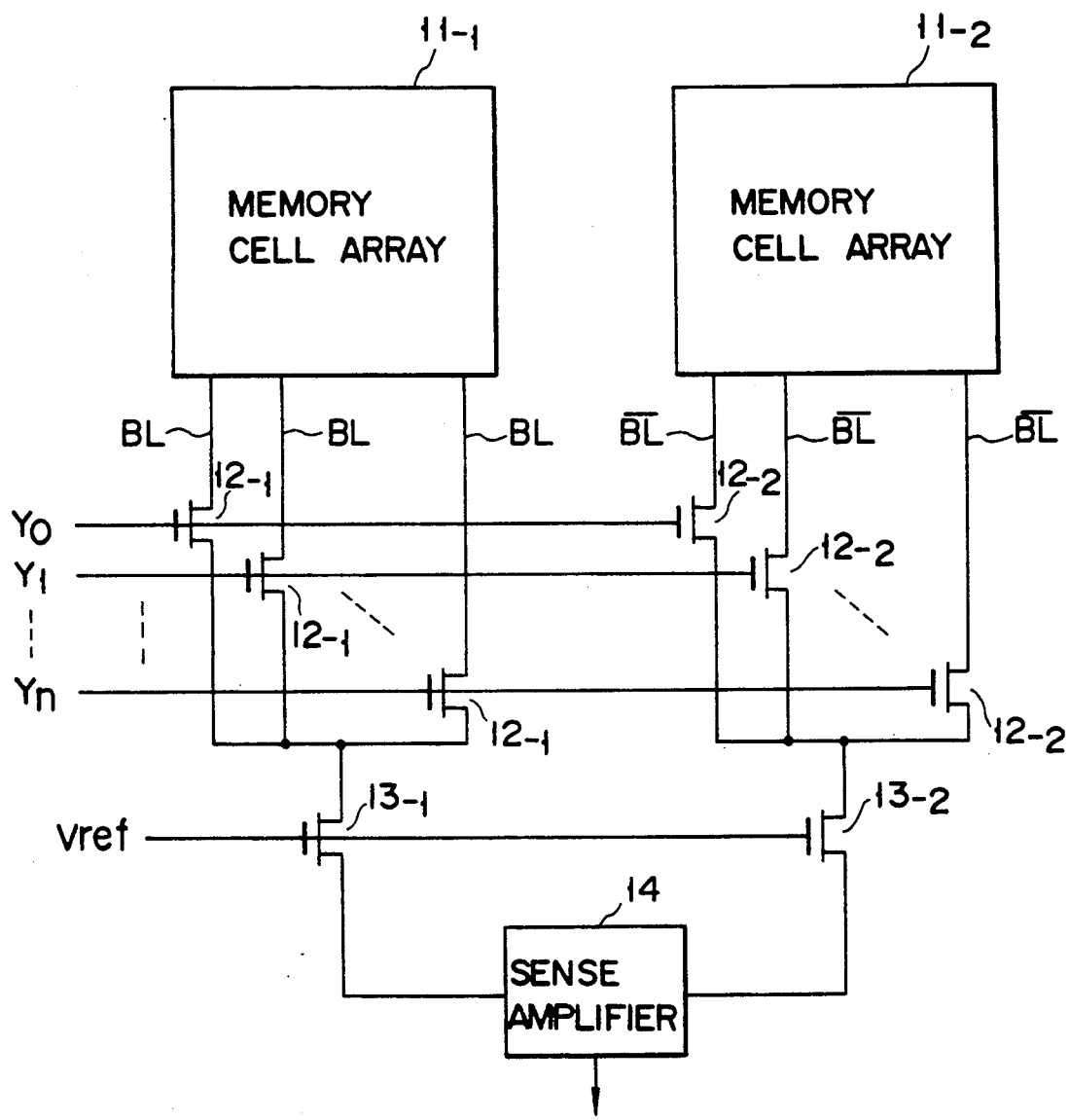
F I G. 3

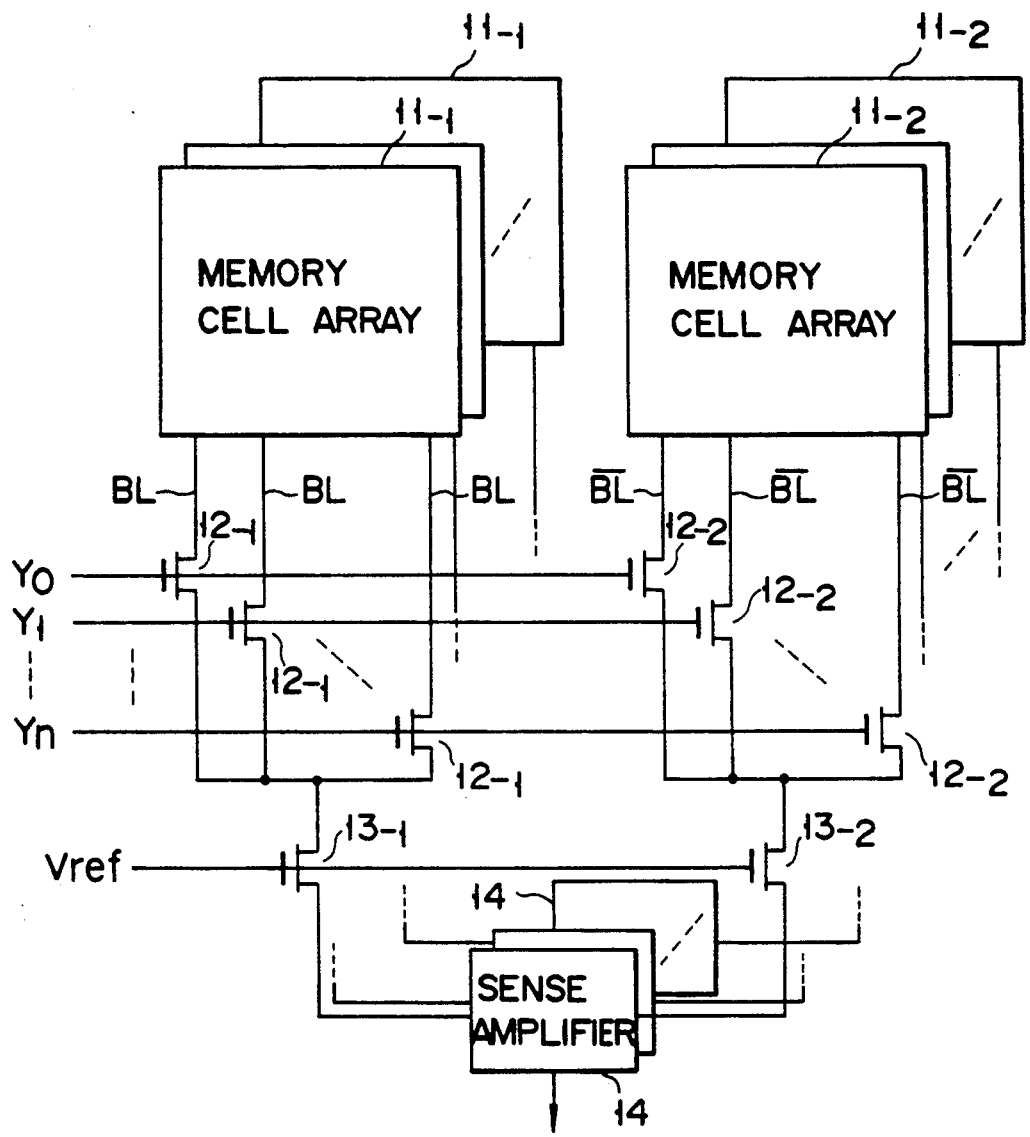
F I G. 7

5,291,045

NON-VOLATILE SEMICONDUCTOR MEMORY DEVICE USING A DIFFERENTIAL CELL IN A MEMORY CELL

BACKGROUND OF THE INVENTION

1. Field of the Invention

The present invention relates a non-volatile semiconductor memory device using a non-volatile transistor in a memory cell.

2. Description of the Related Art

In a non-volatile semiconductor memory such as an EPROM (erasable programmable read only memory), a memory cell conventionally consists of one transistor, and "1" or "0" level of data is determined by turning on or off a selected memory.

In recent years, a high-speed operation of a semiconductor memory has been required as the processing speed of a CPU is increased. In accordance with this, conventionally, several types of EPROMs capable of performing high-speed operations are disclosed in some literatures. For example, "A 25 ns 16K CMOS PROM using a 4-Transistor Cell" is described in the "ISSCC, DIGEST OF TECHNICAL PAPERS" in pp. 162-163 published in the United States on Feb., 1985, ::A 23 ns 256K EPROM with Double-Layer Metal and Address Transition Detection" is described in the ISSCC, DIGEST OF TECHNICAL PAPERS" in pp. 130-131 published in the United States on Feb., 1985, and "16 ns CMOS EPROM" is issued in the subcommittee of the Institute of Electrical and Electronics Engineers of Japan, 1989.

Memory cells known as differential cells are applied to the EPROMs described in the above literatures. In the differential cell, a memory cell consists of at least two transistors. In a data write mode, the two transistors are set in two different states such as high and low states of a threshold voltage depending on an injection state of electrons. In a data read mode, readout potentials from the two transistors are compared by a sense amplifier to read out data.

The differential cell has a larger noise margin than that of a general conventional memory cell consisting of one transistor and operated such that a readout potential from a cell transistor is compared with an intermediate level serving as a reference potential. Therefore, the differential cell is advantageously suitable for a high-speed operation.

A pattern layout of the differential cell will be described below. Conventionally, the differential cell has a layout in which two transistors are arranged to be adjacent to each other.

FIG. 1 is a circuit diagram showing a read circuit of a conventional EPROM having a differential cell. As shown in FIG. 1, conventionally, a pair of bit lines BL and $\overline{BL}$ selected by two column selecting transistors 1-1 and 1-2 are arranged to be adjacent to each other. A plurality of bit lines BL are commonly connected to a transistor 2-1 serving as a transfer gate, and a plurality of bit lines $\overline{BL}$ having the same number as that of the bit lines BL are commonly connected to a pass transistor 2-2 serving as a transfer gate. The pass transistors 2-1 and 2-2 are connected to a sense amplifier 3. In the sense amplifier 3, the potentials of a pair of bit lines BL and $\overline{BL}$ selected by the column selecting transistors 1-1 and 1-2 are applied, and the potentials are compared with each other to detect readout data from a memory cell (not shown).

In the EPROM with the above arrangement, one memory cell consists of two transistors for respectively storing different signal levels, and the two transistors are arranged to be adjacent to each other. According to this pattern layout, the following problem is posed.

In FIG. 1, column selecting transistors 1-1 and 1-2 are difficult to be arranged. The size of a memory cell is minimized, and a pitch in a column direction has a minimum size. In this state, since two bit lines BL and $\overline{BL}$ must be parallelly arranged in a direction perpendicular to the column direction, it is very difficult to arrange the bit lines. In addition, even if the bit lines can be arranged as a pattern, since portions 4 where the bit lines cross each other are formed and one of two bit lines must be jumped over the other by using another wiring means such as a diffusion layer, the wiring pattern is complicated. Furthermore, since the wiring resistances of the bit lines are different from each other symmetry of the column selecting transistors is degraded.

With the above arrangement, symmetry of the differential cell is degraded. For example, a differential cell shown in FIG. 2A is known as an interleaved cell, and the interleaved cell consists of two staggered non-volatile transistors. FIG. 2B is an equivalent circuit diagram of FIG. 2A. In the memory cell in FIG. 2B, word lines WL are arranged to cross bit lines BL and $\overline{BL}$. Since different signal levels must be read out from a pair of transistors to the pair of bit lines, one word line WL is commonly used for a pair of transistors MR and $\overline{MR}$ which are obliquely adjacent to each other through a source line SL in FIG. 2B.

In general, impurity ions are implanted in the channel regions of two transistors constituting a memory cell to control a threshold voltage, and a predetermined angle is given to the implantation direction upon the ion implantation to form a shallow channel region having good characteristics. For this reason, in an interleaved cell, since directions of implantation in the channel regions of two transistors constituting a 1-bit memory cell are different from each other when the directions are viewed from the sources of the two transistors, the transistors MR and $\overline{MR}$, characteristics of which are preferably equal to each other, become different from each other in characteristics.

Since source lines wired to be in contact with the source regions are every several bit lines BL and $\overline{BL}$ alternately arranged, the positions of the source lines and the corresponding pair of transistors are not symmetrical. This arrangement is formed not only in the interleaved cell but in all differential cells in which bit lines BL and $\overline{BL}$ are alternately arranged.

As described above, in a conventional non-volatile semiconductor memory device, two transistors constituting a 1-bit memory cell are arranged to be adjacent to each other. Therefore, since a pair of bit lines must be alternately arranged, column selecting transistors are difficult to be arranged, characteristics of two transistors constituting the memory cell are disadvantageously different from each other.

SUMMARY OF THE INVENTION

It is, therefore, an object of the present invention to provide a non-volatile semiconductor memory device having a layout in which the pattern layout of a column selecting transistor is simplified and the characteristics of two transistors constituting a memory cell are equal to each other.

The object of the present invention can be achieved by the following arrangement.

According to the present invention, there is provided a non-volatile semiconductor memory device characterized in that each of memory cells for storing 1-bit data consists of two transistors, one transistor constituting each of the memory cells is formed in a first memory cell array consisting of a plurality of bit lines and a plurality of word lines, and the other transistor constituting each of the memory cells is formed in a second memory cell array consisting of a plurality of bit lines and a plurality of word lines.

According to the arrangement of the present invention, the two transistors constituting a 1-bit memory cell are respectively formed in different memory cell arrays, and the memory cell arrays, column selecting transistors, or the like can be patterned to be symmetrical.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing an arrangement of a read circuit of a conventional EPROM using differential cells;

FIG. 2A is a plan view of a pattern showing memory cells of the conventional EPROM using differential cells;

FIG. 2B is an equivalent circuit diagram showing the conventional EPROM in FIG. 2A;

FIG. 3 is a circuit diagram showing an arrangement according to an embodiment of the present invention;

FIG. 7 is a circuit diagram showing an arrangement according to a modification of the present invention.

DETAILED DESCRIPTION OF THE PREFERRED EMBODIMENTS

An embodiment of the present invention will be described below with reference to the accompanying drawings.

FIG. 3 is a circuit diagram showing an arrangement of a read circuit when the present invention is applied to an EPROM. A plurality of differential cells each consisting of first and second non-volatile transistors for storing 1-bit data ar formed in memory cell arrays 11-1 and 11-2, and a pair of cells are respectively formed in the different memory cell arrays. That is, the first non-volatile transistors constituting the differential cells are formed in the memory cell array 1-1, and the second non-volatile transistors constituting the differential cells are formed in the memory cell array 1-2.

The transistors formed in the memory cell array 11-1 are respectively connected to a plurality of bit lines BL, ... Column selecting transistors 12-1, ..., the gates of which receive column selecting signals $Y_0, Y_1, \ldots Y_n$, are respectively connected midway along the plurality of bit lines BL, ... The potentials of the bit lines BL selected by the column selecting transistors 12-1, ... are applied to one input terminal of a sense amplifier 14 through a pass transistor 13-1. Similarly, the transistors formed in the memory cell array 11-2 are respectively connected to a plurality of bit lines $\overline{BL}$ ..., and column selecting transistors 12-2, ..., the gates of which receive the column selecting signals $Y_0, Y, \ldots, Y_n$, are connected midway along the plurality of bit lines $\overline{BL}$ ... The potentials of the bit lines $\overline{BL}$ selected by the column selecting transistors 12-2, ... are applied to the other input terminal of the sense amplifier 14 through a pass transistor 13-2.

In the EPROM of this embodiment, each memory cell for storing 1-bit data consists of two transistors, and the two transistors are formed to be separated from each other in the different memory cell arrays 11-1 and 11-2. In addition, the bit lines BL, ... are connected to the memory cell array 11-1, and the bit lines $\overline{BL}$ ... are connected to the memory cell array 12-2.

With the above arrangement, unlike a conventional arrangement, the two column selecting transistors 12-1 and 12-2 which receive the same column selecting signal are not adjacent to each other but arranged to be separated by a predetermined distance. Therefore, the bit lines BL, ... and the bit lines $\overline{BL}$ ... do not cross each other. For this reason, the bit lines need not jump by using a diffusion layer or the like, and a wiring pattern can be easily formed. In addition, since a variation in wiring resistance between the bit lines is decreased, symmetry of the column selecting transistors is not degraded.

Figure 4:
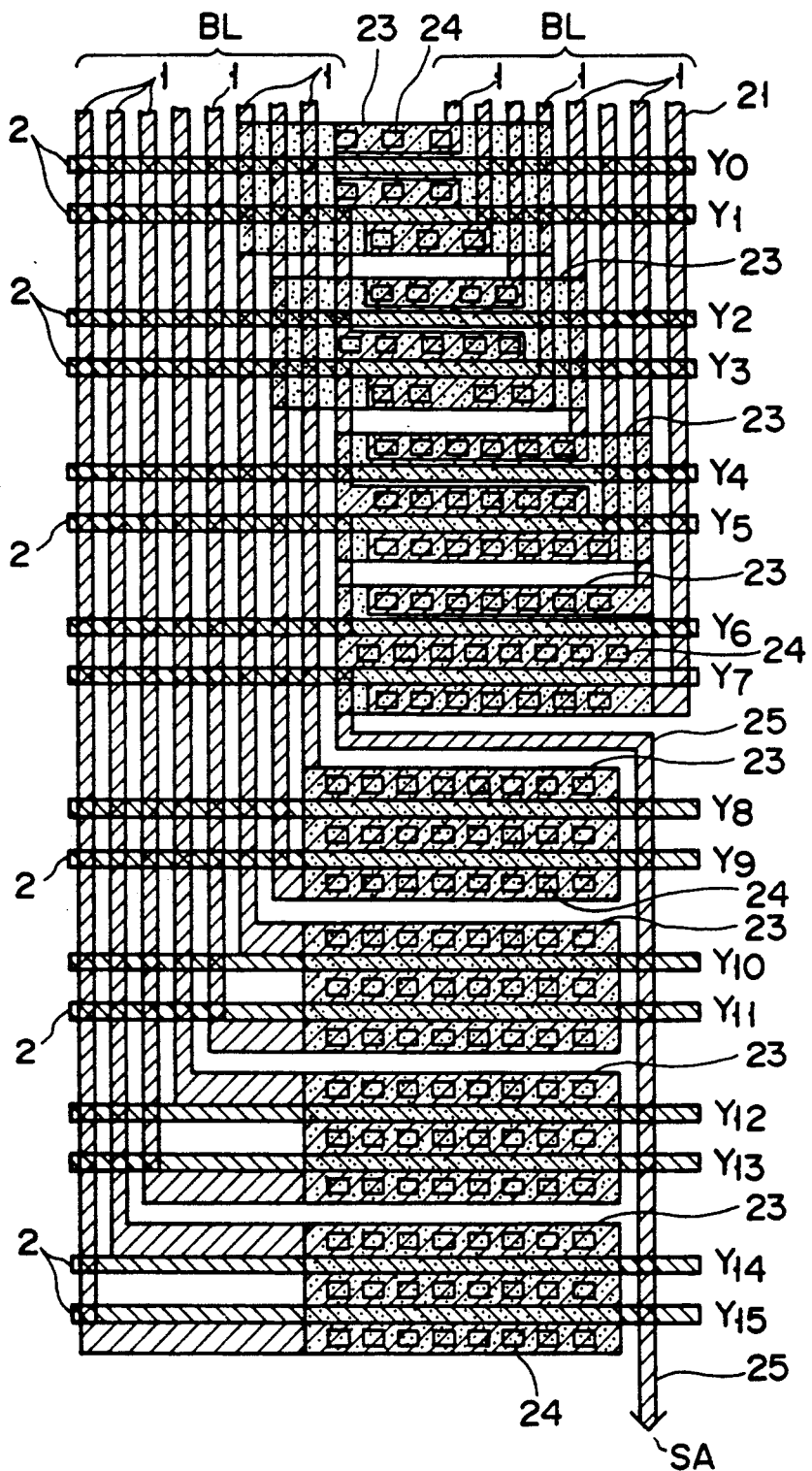
FIG. 4 is a plan view of a pattern showing an arrangement of a column selector section in the circuit in FIG. 3.

FIG. 4 is a plan view of a pattern showing an arrangement of a column selecting transistor section (column selector) on the memory cell array 11-1 side in the circuit in FIG. 3. Note that the column selector on the memory cell array 11-2 side is arranged as described above. In FIG. 4, a column selecting signal is a 16-bit signal consisting of bits $Y_0, Y_1, \ldots, Y_{15}$, and any one of sixteen bit lines BL, ... is selected by the 16-bit signal. Conductive patterns 21, ... which vertically extend in FIG. 4 serve as the bit lines BL, and the conductive patterns are connected to the memory cell array 11-1 in FIG. 3. Conductive patterns 22 which are formed to cross the conductive patterns 21 are gate wires of the column selecting transistors 12-1 in FIG. 3. In addition, reference numeral 23 denote diffusion regions serving as source and drain regions of the column selecting transistors, each of the diffusion regions 23 is connected to a corresponding one of the conductive patterns 21 through a predetermined contact hole 24. A conductive pattern 25 located in the center in FIG. 4 is connected to the diffusion regions 23 serving as common source or drain regions through the contact hole 24, and the conductive pattern 25 is connected to one input terminal of the sense amplifier (SA) 14 through the pass transistor 13-1.

Since the column selector with the above arrangement does not have any overlapping pattern but has simple pattern repetition, it can be easily formed. In addition, since the patterns have simple structures, pattern symmetry between the memory cell arrays 11-1 and 11-2 can be easily obtained, and characteristics of elements constituting a memory cell including column selecting transistors can be uniformed.

Figure 5:
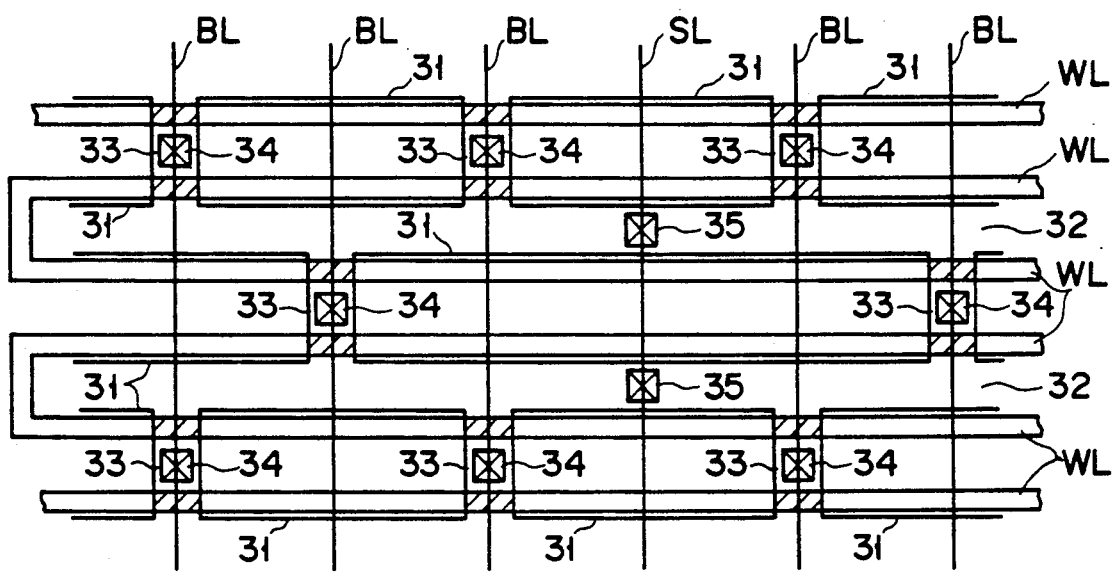
FIGS. 5 and 6 are plan views showing arrangements of an memory cell array section of the circuit in FIG. 3.

FIG. 5 is a plan view of a pattern showing an arrangement of the memory cell array 11-1 of the circuit in FIG. 3. As described above, each of memory cells consists of first and second transistors, the first transistors of the memory cells are formed in the memory cell array 11-1. In FIG. 5, a plurality of word lines WL are formed to horizontally cross a plurality of element isolation regions 31. The word lines WL are opposite to each other through the common source regions 32 vertically sandwiched by the element isolation regions 31 in FIG. 5, and the word lines WL are wired such that each pair of word lines WL are set at the same potential. In hatched regions (FIG. 5) which are horizontally sandwiched by the element isolation regions 31, floating gates are formed on the underlayer of the word lines WL. Two non-volatile transistors are staggered in each region. A plurality of bit lines BL are formed to cross the word lines WL, and the bit lines BL are connected through drain contacts 34 to the common drain region 33 for a pair of transistors sandwiched by one element isolation region 31.

Source lines SL which are connected to the source regions 32 of the transistors through source contacts 35 are formed every N (N is a positive number) bit lines of the plurality of bit lines BL. Note that although each of the source lines SL may be formed every other bit line BL, when a resistance between the source of each transistor and the source line SL can be neglected, each of the source lines SL can be formed every several bit lines as shown in FIG. 5.

Although the memory cell array 11-2 is not shown, the memory cell array 11-2 can be arranged to have the same pattern layout as described above. That is, when impurity ions are implanted in channel regions of two transistors constituting each memory cell to control a threshold voltage, the impurity ions can be implanted in the transistors of the memory cell array 11-1 and 11-2 at the same angle in the same direction. Therefore, characteristics of two transistors of each of the memory cells can be easily uniformed. In addition, since a source line is formed every N (N is a positive number) bit lines $\overline{BL}$, the same pattern layout as shown in FIG. 5 can be obtained. Thus, the source lines SL are formed to have equal intervals in the memory cell arrays 11-1 and 11-2, and distances between the source lines SL and the memory cells can be averaged.

As described above, according to this embodiment, in a memory using differential cells, symmetric memory cell patterns can be obtained in two memory cell arrays. Since a pair of data storing transistors are connected to a sense amplifier through signal lines having the same pattern, a desired layout can be obtained in the differential cells. In addition, since signal lines having different data need not be alternately arranged, pattern formation is simplified, thereby improving symmetry and reliability of the characteristics of the transistors.

Figure 6:
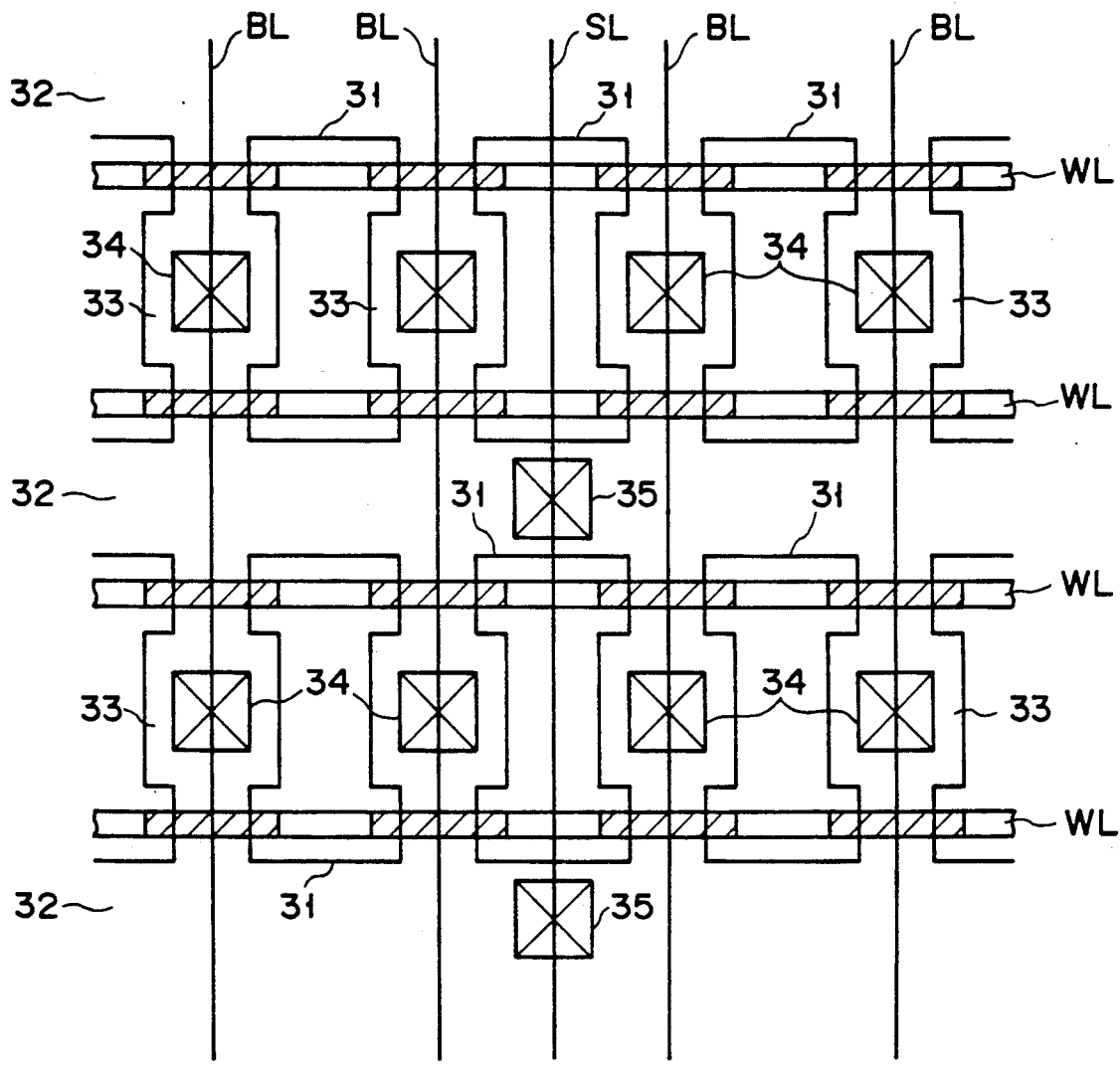

According to the above embodiment of the present invention, a memory cell array has been described by taking an interleaved arrangement pattern as an example. However, as shown in FIG. 6, when a normal memory cell array consisting of transistors which are not alternately arranged or a modification thereof is used, the same effect as described above can be expected. The same reference numerals as in FIG. 5 denote the same parts in FIG. 6. That is, FIG. 6 is a plan view of a pattern showing an arrangement of the memory cell array 11-1 in FIG. 3. In FIG. 6, one transistor of each of differential cells is formed in the memory cell array 11-1. A floating gate is formed on the underlayer of the word lines WL in hatched regions a hatched between the element isolation regions 31 to form a non-volatile transistor. A plurality of bit lines BL are formed to cross the word lines WL, and the bit lines BL are connected to the common drain region 33 of a pair of transistors located between one element isolation region 31 through a drain contact 34. Each of source lines SL connected to the common source region 32 of the transistors through a source contact 35 is formed every N bit lines (N is a positive number) of the plurality of bit lines BL. In addition, the memory cell array 11-2 in FIG. 3, the same pattern layout (not shown) as shown in FIG. 6 is used, and each of the source lines SL is formed ever N bit lines of the plurality of bit lines $\overline{BL}$.

In the above description, the present invention is applied to an EPROM having two memory cell arrays. However, as shown in FIG. 7, each of the two memory cell arrays 11-1 and 11-2 may be divided into a plurality of blocks. In this case, the divided memory cell arrays on the BL side and the divided memory cell arrays on the $\overline{BL}$ side are paired, and the sense amplifier 14 is arranged for every pair of memory cell arrays.

As described above, according to the present invention, there is provided a non-volatile semiconductor memory device having a layout in which column selecting transistors have a simple pattern layout and characteristics of two transistors constituting a memory cell are equal to each other.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A non-volatile semiconductor memory device in which each memory cell for storing 1-bit data consists of two non-volatile transistors, comprising:
   a first memory cell array in which first transistors constituting said memory cells each having a source common pattern layout are staggered with respect to a common source region, and a second memory cell array in which second transistors constituting said memory cells are staggered with respect to a common source region;
   word lines in which every two word lines connected to said first and second memory cell arrays and sandwiching said common source region are connected to the same potential;
   first bit lines connected to said first memory cell array;
   second bit lines connected to said second memory cell array;
   bit line selecting means for selecting said first and second bit lines; and
   a data sense circuit for comparing signal levels of said first and second bit line selected by said bit line selecting means so as to detect data.

2. A device according to claim 2, wherein physical addresses of memory cells selected by the same address signal are located at identical positions of the first and second memory cells.

3. A device according to claim 1, wherein said first and second memory cell arrays are divided into a plurality of blocks, and said data sense circuit is arranged every pair constituting each of the plurality of blocks of said first and second memory cell arrays.

4. A device according to claim 1, wherein a source line is arranged every N (N is a positive number) bit lines of said first bit lines in said first memory cell array, a source line is arranged every N (N is a positive number) bit lines of said second bit lines in said second memory cell array, and said first and second bit lines are arranged every $M \times N (M=1, 2 ...)$ lines with respect to said source lines to obtain a symmetrical layout.

* * * * *